(12) United States Patent
Goossens

(10) Patent No.: US 10,749,454 B2
(45) Date of Patent: Aug. 18, 2020

(54) HALL-EFFECT SENSOR SIGNAL OFFSET CORRECTION IN PHASE COMMUTATION

(71) Applicant: DANA AUTOMOTIVE SYSTEMS GROUP, LLC, Maumee, OH (US)

(72) Inventor: Stijn Goossens, Erpe-Mere (BE)

(73) Assignee: DANA BELGIUM N.V., Bruges (BE)

(*) Notice: Subject to any disclaimer, the term of this patent is extended or adjusted under 35 U.S.C. 154(b) by 0 days.

(21) Appl. No.: 16/471,814

(22) PCT Filed: Dec. 21, 2017

(86) PCT No.: PCT/US2017/067908
§ 371 (c)(1),
(2) Date: Jun. 20, 2019

(87) PCT Pub. No.: WO2018/119238
PCT Pub. Date: Jun. 28, 2018

(65) Prior Publication Data
US 2020/0119667 A1    Apr. 16, 2020

Related U.S. Application Data

(60) Provisional application No. 62/437,214, filed on Dec. 21, 2016.

(51) Int. Cl.
*H02P 6/182*   (2016.01)
*H02P 6/15*    (2016.01)
(Continued)

(52) U.S. Cl.
CPC ........... *H02P 6/182* (2013.01); *G01D 5/2448* (2013.01); *G01R 33/075* (2013.01); *H02P 6/157* (2016.02)

(58) Field of Classification Search
CPC ...... H02P 1/00; H02P 1/04; H02P 1/24; H02P 1/26; H02P 1/42; H02P 1/46; H02P 3/00;
(Continued)

(56) References Cited

U.S. PATENT DOCUMENTS 6,104,152 A * 8/2000 Coles .................. H02P 6/10
                                                    318/400.04
7,095,194 B2   8/2006 Kro
                  (Continued)

OTHER PUBLICATIONS

Beccue, Philip B., Compensation for Asymmetries and Misalignment in a Hall-Effect Position Observer Used in PMSM Torque-Ripple Control, IEEE Transactions on Industry Applications, vol. 43, Issue No. 2, pp. 560-570, 2007, https://ieeexplore.ieee.org/document/4132858.

(Continued)

*Primary Examiner* — Antony M Paul
(74) *Attorney, Agent, or Firm* — McCoy Russell LLP

(57) ABSTRACT

A method of operating a final drive unit clutch. The method provides an electric motor coupled with a clutch. The electric motor including a stator, a first Hall-effect sensor coupled with the stator, a second Hall-effect sensor coupled with the stator, a third Hall-effect sensor coupled with the stator, and a rotor having at least one magnetic pole pair. The method also provides for a controller in electrical communication with the electric motor. The method includes determining a first ideal commutation point, and calculating a first offset of a first Hall-effect sensor state change from the first ideal commutation point. The method further includes calculating a time delay of commutation, during the clutch transition between a non-torque transmitting position and a torque transmitting position, utilizing the first offset such that a second Hall-effect sensor state change corresponds with a second ideal commutation point.

11 Claims, 18 Drawing Sheets

(51) Int. Cl.
*G01D 5/244* (2006.01)
*G01R 33/07* (2006.01)

(58) Field of Classification Search
CPC .. H02P 6/00; H02P 6/002; H02P 6/005; H02P
6/007; H02P 6/008; H02P 6/04; H02P
6/08; H02P 6/10; H02P 6/12; H02P 6/14;
H02P 6/16; H02P 6/22; H02P 6/147;
H02P 8/08; H02P 15/00; H02P 21/00;
H02P 21/0035; H02P 21/146; H02P
23/00; H02P 23/03; H02P 25/00; H02P
25/021; H02P 27/00; H02P 27/04; H02P
27/06
USPC .... 318/400.01, 400.02, 400.14, 400.15, 700,
318/701, 721, 779, 799, 800, 801, 430,
318/432
See application file for complete search history.

(56) References Cited

U.S. PATENT DOCUMENTS

| 7,423,396 | B2 | 9/2008 | Bolt |
| 7,808,200 | B2 | 10/2010 | Liu |
| 7,896,146 | B2 | 3/2011 | Pritchard |
| 8,487,565 | B2 | 7/2013 | Dai |
| 9,525,371 | B2 | 12/2016 | Boscolo Berto |
| 9,546,722 | B2 | 1/2017 | Fox |
| 2004/0007998 | A1* | 1/2004 | Yasohara ............... H02P 6/10 |
| | | | 318/437 |
| 2010/0264862 | A1 | 10/2010 | Kitagawa |
| 2012/0279791 | A1 | 11/2012 | Anderson |
| 2017/0126154 | A1 | 5/2017 | Shim |

OTHER PUBLICATIONS

European Patent Office, International Search Report with Written Opinion issued in PCT/US2017/067908, dated Mar. 16, 2018, 12 pages, Rijswijk Netherlands.

Park, Joon Sung et al., Compensation Method of Position Signal Error with Misaligned Hall-Effect Sensors of BLDC Motor, Journal of Electrical Engineering and Technology, 4. Apr. 2016: , pp. 709-717, Seoul, South Korea.

Samoylenko, Nikolay et al., Dynamic Performance of Brushless DC Motors with Unbalanced Hall Sensors, IEEE Transactions on Energy Conversion, Sep. 2008; pp. 752-763; vol. 23, No. 3. Vancouver, BC Canada.

* cited by examiner

| SECTOR | HALL STATE | SECTOR WIDTH |
|---|---|---|
| I | 3 | $60 + \Phi_A - \Phi_B$ |
| II | 1 | $60 + \Phi_B - \Phi_C$ |
| III | 5 | $60 + \Phi_C - \Phi_A$ |
| IV | 4 | $60 + \Phi_A - \Phi_B$ |
| V | 6 | $60 + \Phi_B - \Phi_C$ |
| VI | 2 | $60 + \Phi_C - \Phi_A$ |

HALL-EFFECT SENSOR SIGNAL OFFSET CORRECTION IN PHASE COMMUTATION

RELATED APPLICATIONS

The present application claims the benefit of U.S. Provisional Patent Application No. 62/437,214 filed on Dec. 21, 2016, which is fully incorporated by reference herein.

BACKGROUND

The present disclosure relates to electric motor commutation during clutch actuation. A conventional brushless direct current ("BLDC") motor typically includes a stator having electromagnetic poles with windings thereon, and a rotor comprising permanent magnets creating permanent magnetic pole pairs. The stator and the rotor magnetically interact with each other when electric current flows in the stator windings. Phase commutation of current flowing through each of the stator windings is performed to create a continuously rotating magnetic field.

Hall-effect sensors in BLDC motors are typically used for magnetic pole position sensing, and to commutate the motor based on the change of the Hall-effect sensor signals. Because the BLDC motor may include a positional tolerance of the Hall-effect sensors, an optimal commutation point may not coincide with the state of commutation signaled by the Hall-effect sensors. The method described herein provides for more consistent BLDC motor performance in final drive unit clutches.

SUMMARY

The present disclosure provides for a method of operating a final drive unit clutch. The method includes providing an electric motor coupled with a clutch. The electric motor including a stator, a first Hall-effect sensor coupled with the stator, a second Hall-effect sensor coupled with the stator, a third Hall-effect sensor coupled with the stator, and a rotor having at least one magnetic pole pair. The method also provides for a controller in electrical communication with the electric motor. The method includes determining a first ideal commutation point, and calculating a first offset of a first Hall-effect sensor state change from the ideal commutation point. The method further includes calculating a time delay of commutation, during the clutch transition between a non-torque transmitting position and a torque transmitting position, utilizing the first offset such that a second Hall-effect sensor state change corresponds with a second ideal commutation point.

BRIEF DESCRIPTION OF THE SEVERAL VIEWS OF THE DRAWINGS

The accompanying drawings are incorporated herein as part of the specification. The drawings described herein illustrate embodiments of the presently disclosed subject matter, and are illustrative of selected principles and teachings of the present disclosure. However, the drawings do not illustrate all possible implementations of the presently disclosed subject matter, and are not intended to limit the scope of the present disclosure in any way.

FIG. 5B is a chart indicating sector, Hall state, and sector width;

DETAILED DESCRIPTION OF EMBODIMENTS

Figure 1:
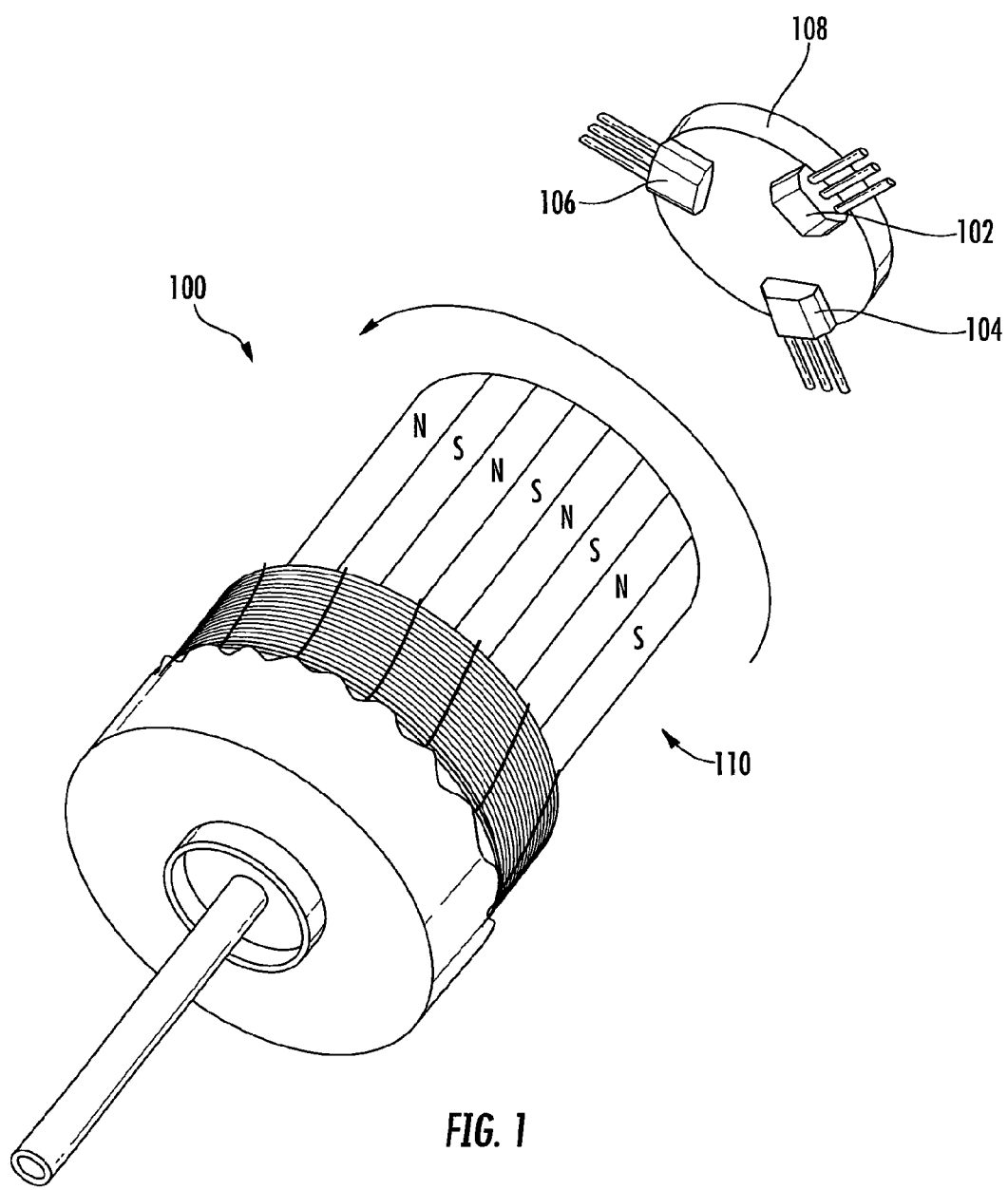
FIG. 1 is a schematic diagram of a BLDC motor according to an embodiment of the presently disclosed subject matter.

It is to be understood that the invention may assume various alternative orientations and step sequences, except where expressly specified to the contrary. It is also to be understood that the specific devices, assemblies, systems and processes illustrated in the attached drawings, and described in the following specification are simply exemplary embodiments of the inventive concepts defined herein. Hence, specific dimensions, directions or other physical characteristics relating to the embodiments disclosed are not to be considered as limiting, unless expressly stated otherwise. Also, although they may not be, like elements in various embodiments described herein may be commonly referred to with like reference numerals within this section of the application.

BLDC motors are utilized in applications across many industries including automotive, aerospace, consumer, medical, industrial automation equipment, and instrumentation applications. In one embodiment, the subject matter disclosed herein may be utilized in the operation of all-wheel drive vehicle connect/disconnect systems. With reference to FIG. 1A, in an embodiment, the subject matter disclosed herein may be utilized to improve the performance of a final drive unit clutch such as rear drive unit clutch 10 in a vehicle 1.

Figure 1A:
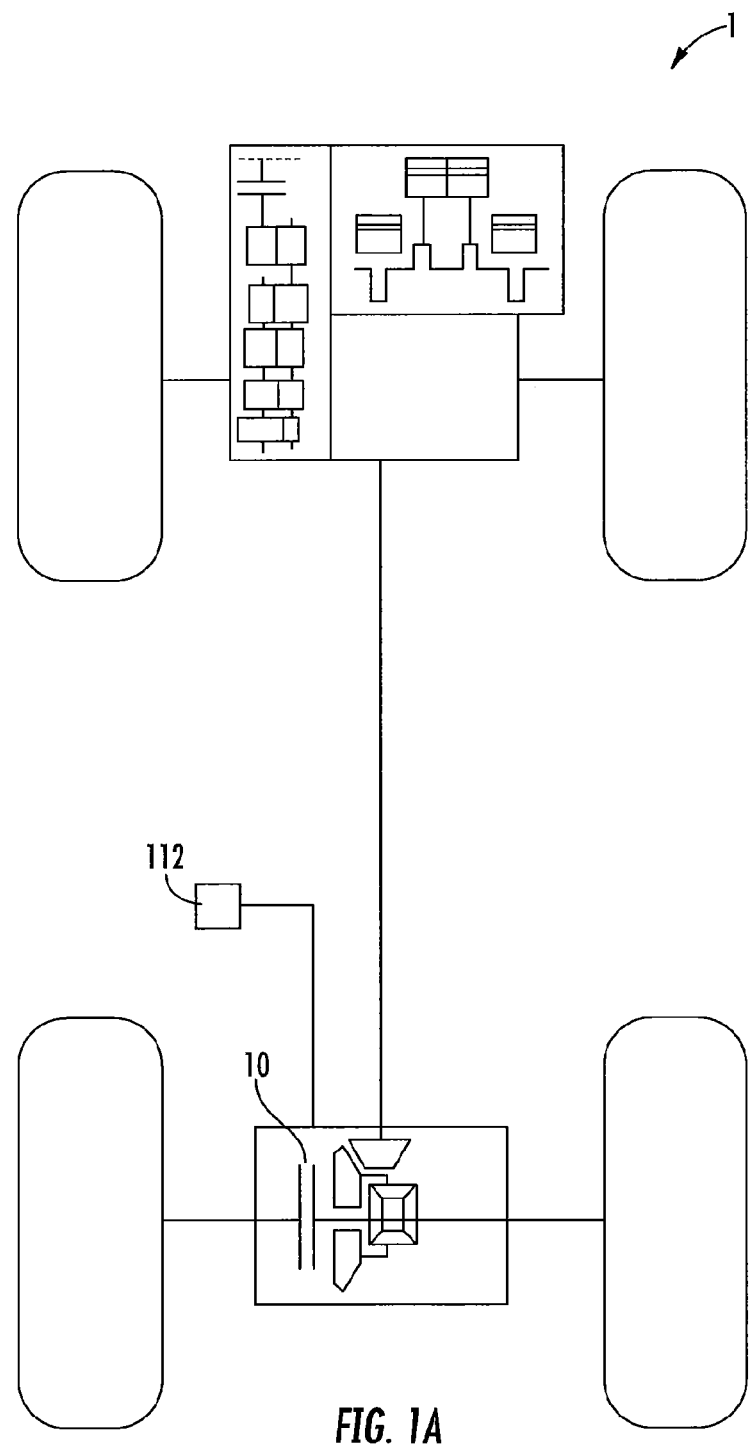
FIG. 1A is a schematic diagram of a vehicle including a final drive unit clutch according to an embodiment of the presently disclosed subject matter.

In an embodiment, as illustrated in FIG. 1, the rear drive unit clutch 10 may comprise a BLDC motor 100. The BLDC motor 100 may utilize a three-phase configuration. Hall-effect sensors 102, 104, 106 are disposed in a stator 108 at a non-driving end of the BLDC motor 100. The three-phase BLDC motor 100 includes a rotor 110 having a plurality of magnetic poles (e.g., two to eight pole pairs). The three-phase BLDC motor 100 has six states of commutation (also referred to herein as Hall states). When all six Hall states in the commutation sequence have been performed, the sequence is repeated to continue the rotation of rotor 110. The number of magnetic pole pairs determines the number of electrical revolutions per mechanical revolution of the rotor 110. For example, in an embodiment where the BLDC motor 100 includes a rotor with two pole pairs, the BLDC motor 100 requires two electrical revolutions to spin the rotor once (i.e., two electrical revolutions produce one mechanical revolution).

When the rotor 110 magnetic poles pass near the Hall-effect sensors 102, 104, 106, the Hall-effect sensors 102, 104, 106 give a high or low signal (i.e., pulse) indicating the passing of a North or South magnetic pole. Based on the combination of the three Hall-effect sensors 102, 104, 106, the exact sequence of commutation can be determined. A Hall state is defined by a predetermined position, or by a continuous set of predetermined positions, of the rotor 110 relative to one or more of the Hall-effect sensors 102, 104, 106.

During operation of the BLDC motor 100, two of the three phases of commutation conduct current while the third phase has zero current in order for the rotor 110 to rotate. The zero current phase may also be referred to as a dead phase. Hall states can be used to create a one-to-one relation with rotor phases and the direction which the voltage needs to be applied. For three phase BLDC motors, there are six possible Hall phase combinations which cover exactly one electrical revolution; therefore, the position resolution using the three phase Hall-effect sensors is limited to one sixth of an electrical revolution.

Figure 2:
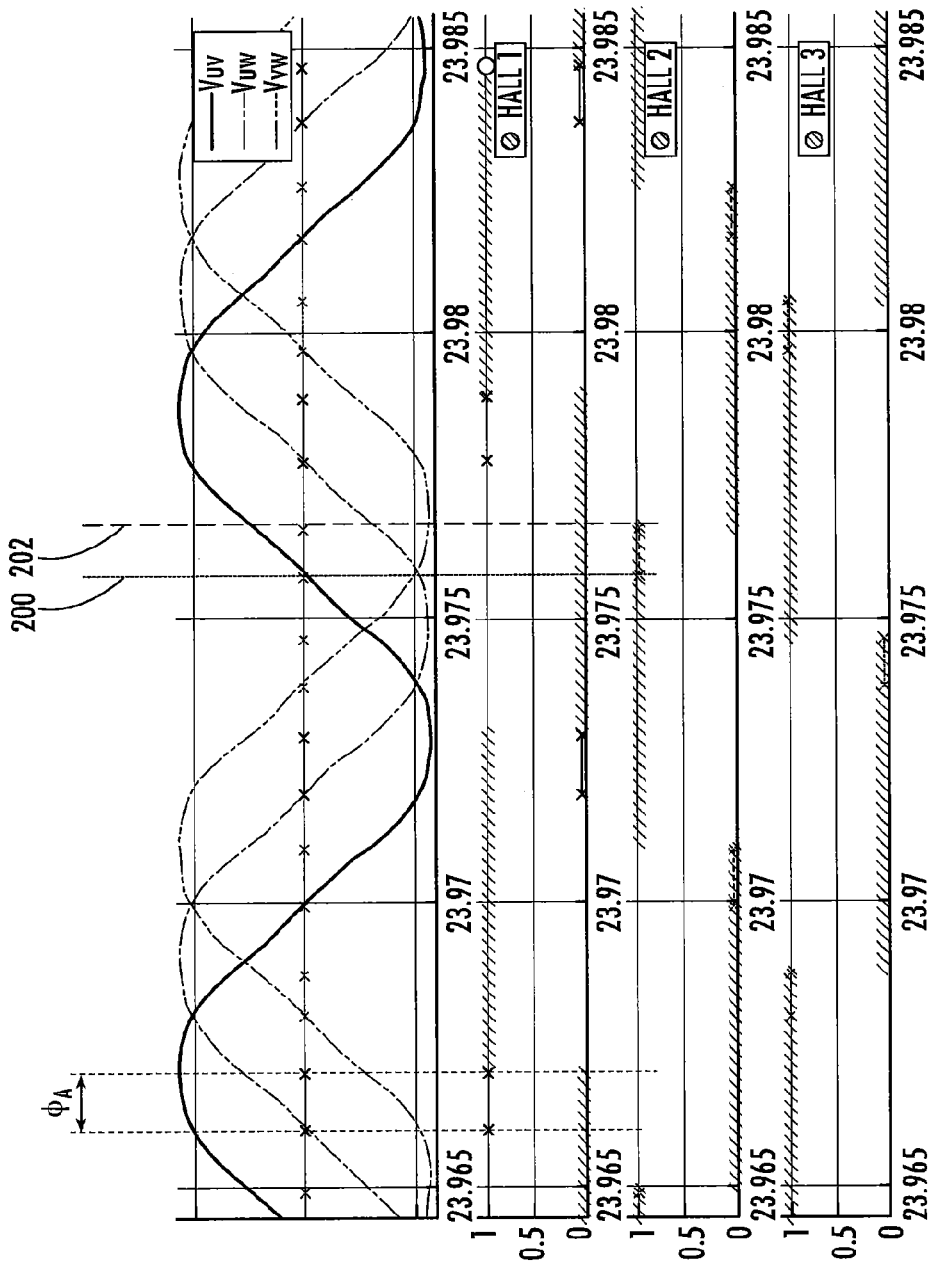
FIG. 2 is a graphic representation of back-EMF waveforms and Hall-effect sensor state changes according to an embodiment of the presently disclosed subject matter.

As illustrated in FIG. 2, there is a first point 200 where the ideal phase commutation occurs, and there is a second point 202 at which the Hall-effect sensors 102, 104, 106 signal phase commutation. FIG. 2 illustrates the timing between the output of the Hall-effect sensor 102, 104, 106 and the back/counter electromotive force ("back-EMF") which acts against the current applied to the stator windings.

Figure 3:
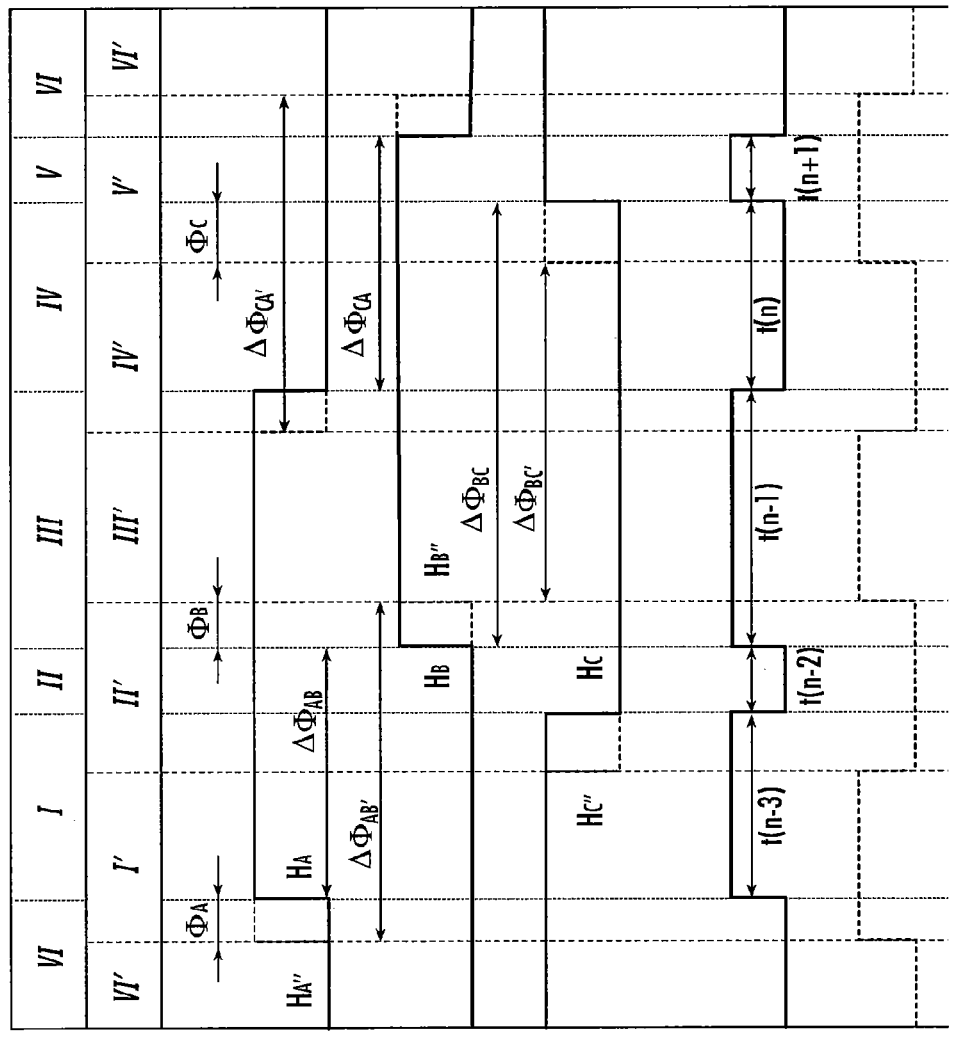
FIG. 3 is a graphic representation of offset BLDC motor phase changes as compared to ideal BLDC motor phase changes according to an embodiment of the presently disclosed subject matter.

A first step in changing Hall states at the optimal commutation point includes utilizing a controller 112 to learn the ideal commutation point and the position offsets of the Hall-effect sensors 102, 104, 106. To learn the offsets during active operation of the motor, the described method makes use of a dead phase during commutation. As illustrated in FIGS. 2 and 3, the Hall-effect sensor offsets are indicated as $\phi_A$, $\phi_B$, $\phi_C$. The Hall-effect sensor offsets $\phi_A$, $\phi_B$, $\phi_C$ describe the difference in rotational position of the Hall-effect sensor signal transition point 202 as compared to the ideal phase commutation point 200.

Figure 4:
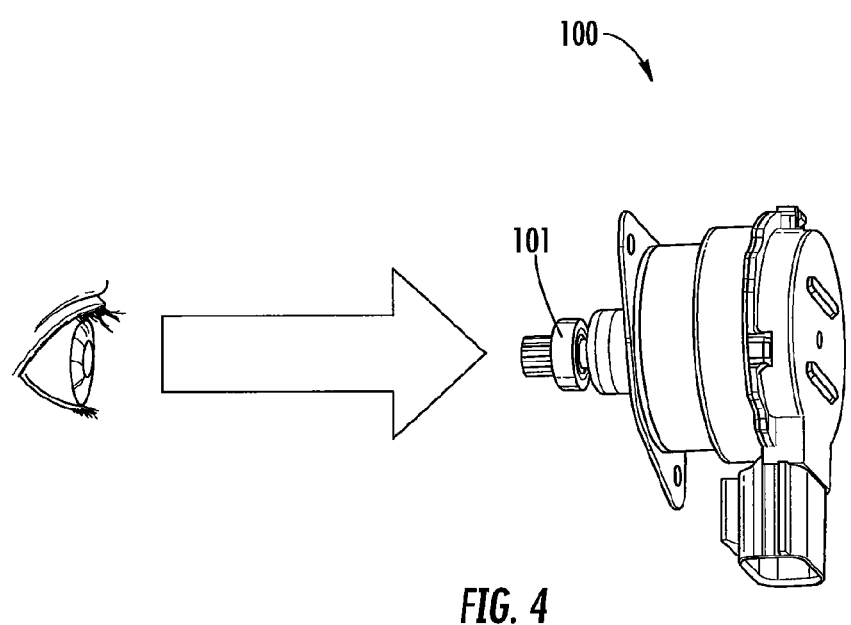
FIG. 4 illustrates a BLDC motor according to an embodiment of the presently disclosed subject matter.

For the following description, the counter clockwise rotational direction of the BLDC motor shaft 101—as seen looking at the shaft 101 as illustrated in FIG. 4—is a positive position increment; consequently, the clockwise rotational direction of the BLDG motor shaft 101 is a negative position increment.

Figure 5A:
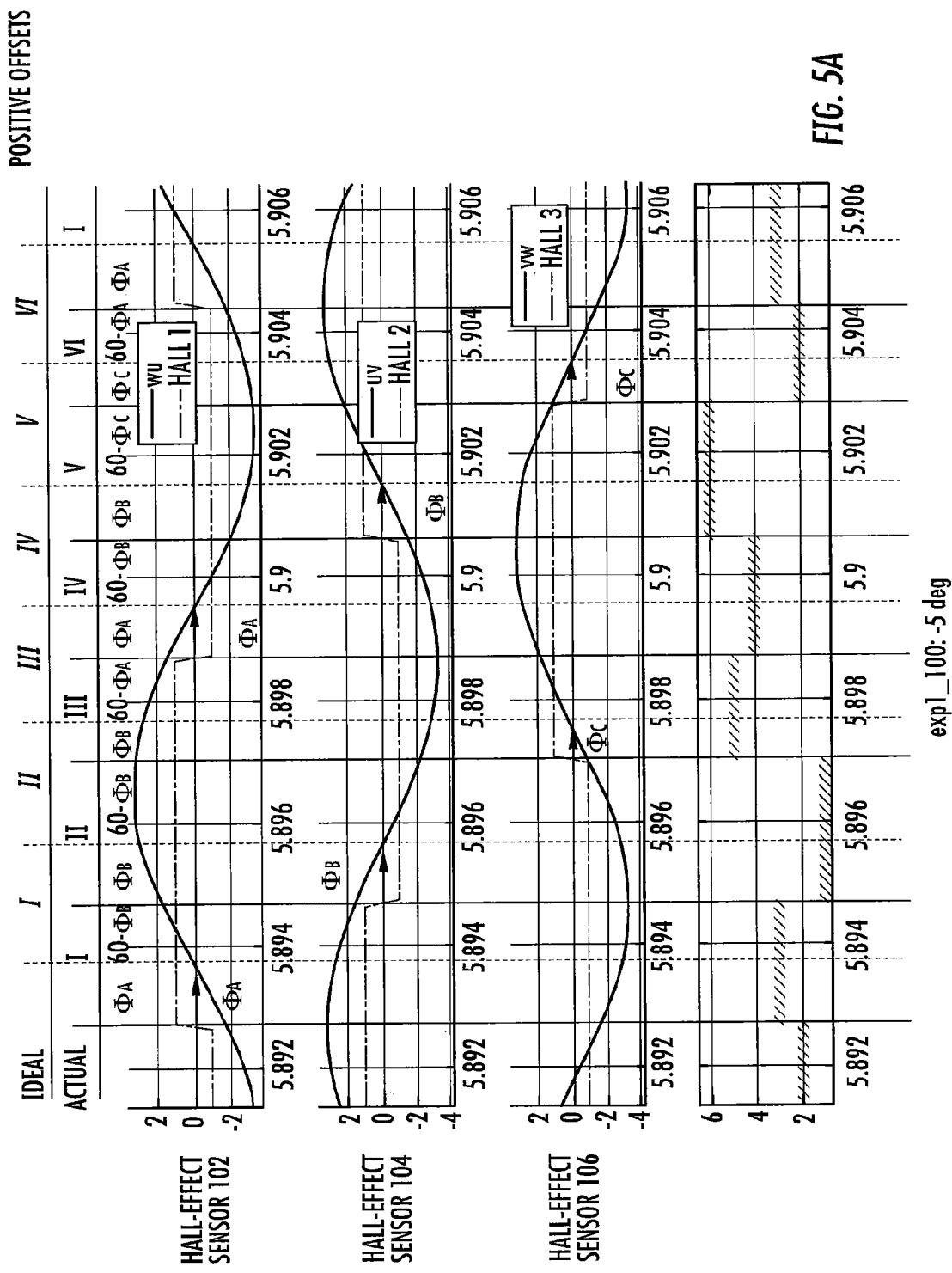
FIG. 5A is a graphic representation of positive position offsets of Hall-effect sensors according to an embodiment of the presently disclosed subject matter.

The graph illustrated in FIG. 5A depicts the positive position offsets $\phi_A$, $\phi_B$, $\phi_C$ of the Hall-effect sensors 102, 104, 106, for counter clockwise rotation of the BLDC motor shaft 101, and compares the ideal phase commutation against the actual phase commutation. The chart illustrated in FIG. 5B identifies the sector, the Hall state, and the sector width.

Figure 6:
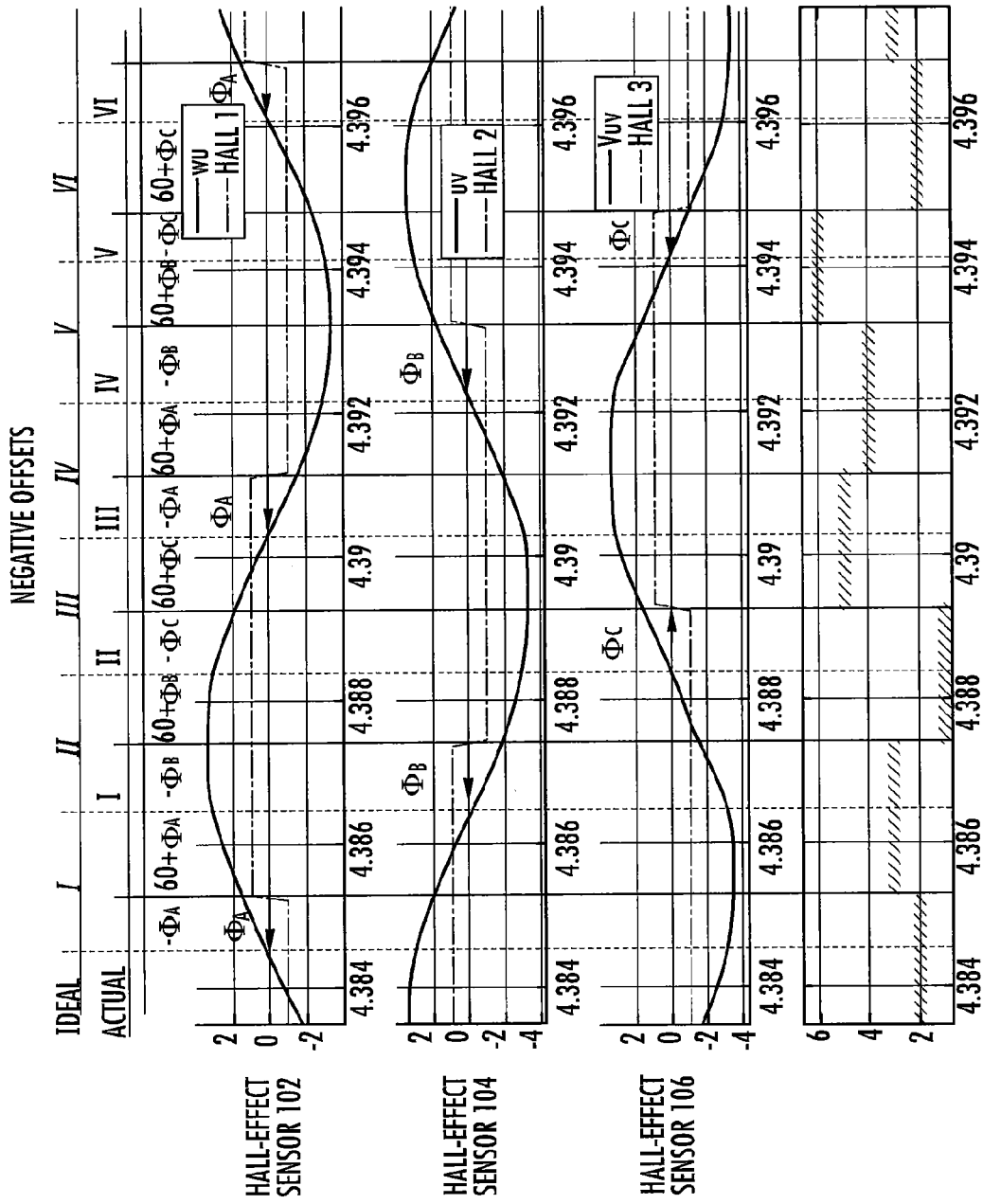
FIG. 6 is a graphic representation of negative position offsets of Hall-effect sensors according to an embodiment of the presently disclosed subject matter.

The graph illustrated in FIG. 6 depicts the negative position offsets $_A$, $\phi_B$, $\phi_C$ of the Hall-effect sensors 102, 104, 106, for clockwise rotation of the BLDC motor shaft 101, and compares the ideal phase commutation against the actual phase commutation. The chart illustrated in FIG. 5B also identifies the sector, the Hall state, and the sector width corresponding to FIG. 6.

From the foregoing, the Hall state can be expressed as:

Hall_state=Hall1+2*Hall2+4*Hall3

Where Hall1 is equal to the state of Hall-effect sensor 102, Hall2 is equal to the state of Hall-effect sensor 104, and Hall3 is equal to the state of Hall-effect sensor 106. The state of each Hall-effect sensor 102, 104, 106 is either 0 or 1. This expression enables the combined state of the three Hall-effect sensors 102, 104, 106 to be stated as one number between 1 and 6.

In an embodiment, calculating the Hall-effect sensor offsets $\phi_A$, $\phi_B$, $\phi_C$ may be performed when the clutch pack (not depicted) of the rear drive unit clutch 10 is between a fully open state, and the kiss point of the clutch plates. The kiss point of the clutch plates is the point at which the clutch pack begins to transmit torque. At this phase of operating the rear drive unit clutch 10, the BLDC motor 100 experiences high speed and low load. The high speed of the BLDC motor 100 produces more back-EMF than a low speed of the BLDC motor 100, thereby producing more reliable calculation of the Hall-effect sensor offsets $\phi_A$, $\phi_B$, $\phi_C$ because the influence of signal noise is reduced.

Figure 7:
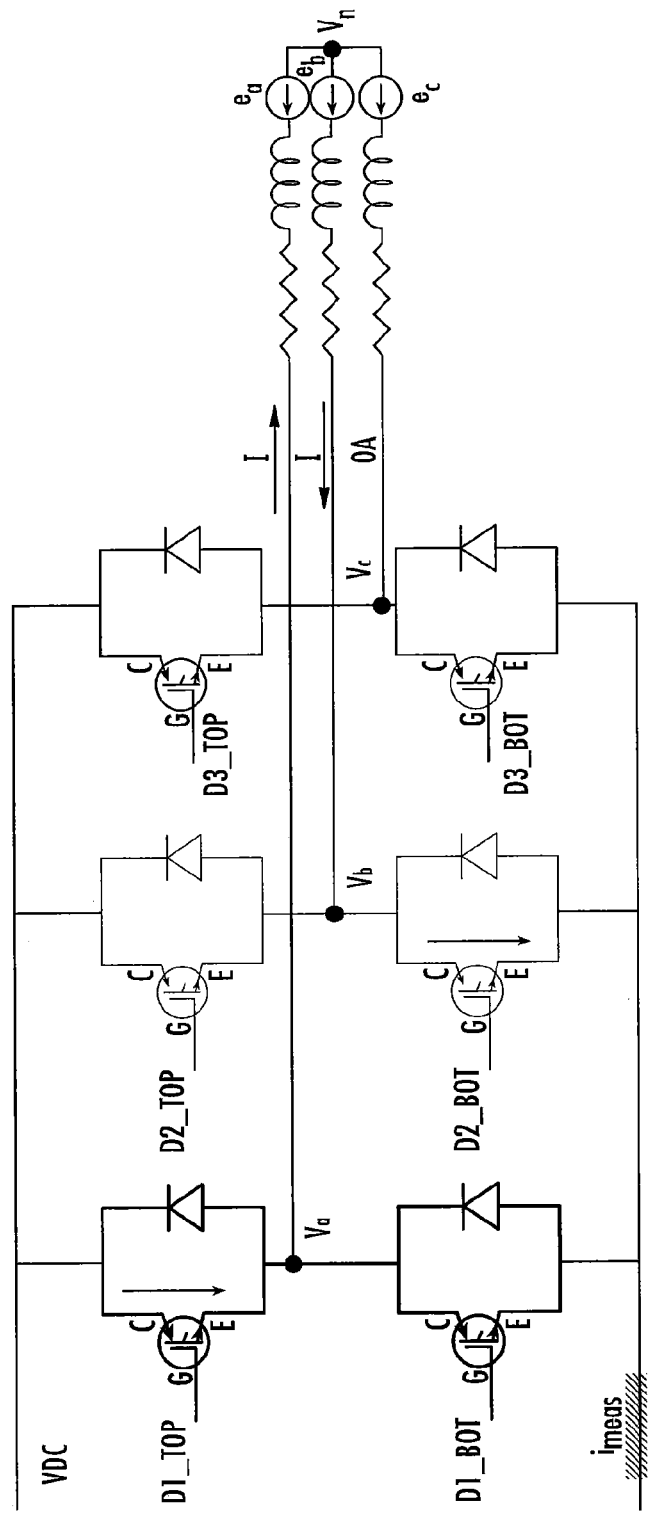
FIG. 7 is a schematic diagram of a BLDC motor circuit according to an embodiment of the presently disclosed subject matter.
Figure 8:
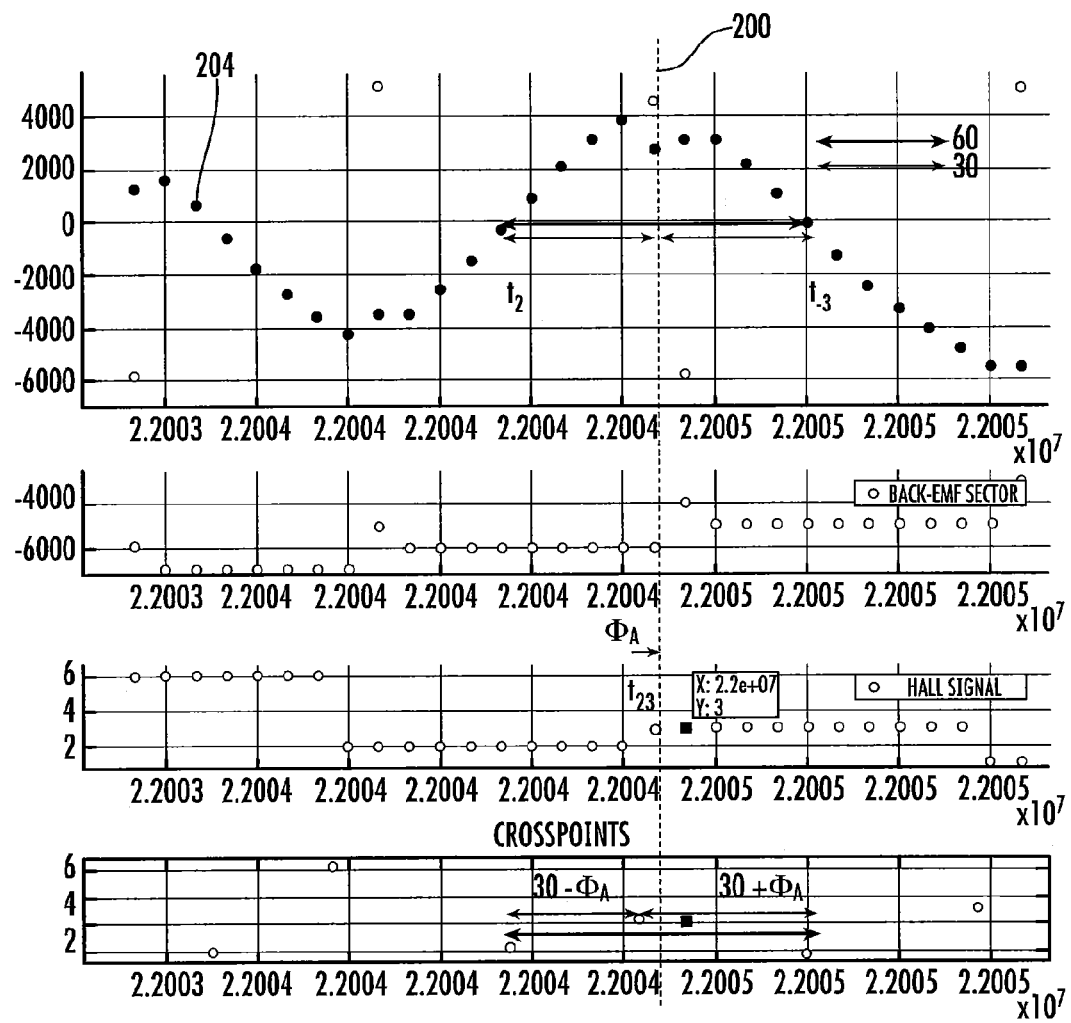
FIG. 8 is a graphic representation of back-EMF and Hall-effect sensor state changes compared with back-EMF sector, Hall-effect sensor state, back-EMF zero-crossing according to an embodiment of the presently disclosed subject matter.

The first step in calculating the Hall-effect sensor offsets $\phi_A$, $\phi_B$, $\phi_C$ may be accomplished by calculating the back-EMF zero-crossing times from three measured phase voltages $V_a$, $V_b$, and $V_c$. In an embodiment, as illustrated in FIG. 7, the back-EMF 'e' may be calculated for the dead phase 'c.' In this example, phase 'c' is currently the dead phase, while phase 'a' and phase 'b' are the active phases in this phase combination. The back-EMF 'e' may be calculated utilizing the following expressions:

$$e_c = V_c - [(V_a + V_b)/2]$$

$$V_n = V_a - RI - L(dI/dt) - e_a$$

$$V_n = V_b + RI + L(dI/dt) - e_b$$

$$e_a + e_b + e_c = 0$$

Sampling phase voltages $V_a$, $V_b$, and $V_c$ at the end of the on or off period for a Hall-effect sensor 102, 104, 106 reduces the effects of resonance/noise. In an embodiment, the sampling point of the three phase voltages $V_a$, $V_b$, and $V_c$ may occur after the 50% on-time. In an embodiment, the phase voltages $V_a$, $V_b$, and $V_c$ may be sampled thirty times to determine the back-EMF at each sampled time.

In another embodiment, the back-EMF zero-crossing may be calculated utilizing one phase voltage $V_c$ and a DC-link voltage $V_{dc}$ at a motor/generator on-time sampling and a motor/generator off-time sampling as expressed below:

motor/generator on-time sampling: $e_c = (2/3)V_c - (V_{dc}/3)$ motor/generator off-time sampling: $e_c = (2/3)V_c$ As illustrated in FIGS. 8, and 12-16, the back-EMF is illustrated over time as plot 204. Utilizing the calculated back-EMF plot 204, the Hall-effect sensor offset $\phi_A$, $\phi_B$, $\phi_C$, may be calculated. In this embodiment, the ideal commutation point 200, 200A, 200B, 200C, 200D, 200E is at a time thirty degrees between each consecutive back-EMF crossing. However, the ideal commutation point may be located at another predetermined time if different performance goals, such as higher motor speed or reduced noise, vibration, and harshness (NVH), were desired. The ideal commutation points can be derived based on the measured phase voltage signals due to induced back-EMF of the motor. As indicated in the expression below, the Hall-effect sensor offset $\phi_A$ may be calculated by subtracting the value of time at $t_{23}$ from the value of time at $t_{-3}$, multiplying the obtained value of time by the speed of the BLDC motor 100, and subtracting 30 from this value.

$$\phi_A = (t_{-3} - t_{23}) * BLDC_{speed} - 30$$

The Hall-effect sensor offset $\phi_A$ may also be calculated by subtracting a value of time $t_2$ from the value of time at $t_{23}$, multiplying this obtained value by the speed of the BLDG motor 100, and subtracting this obtained value from 30.

$$\phi_A = 30 - (t_{23} - t_2) * BLDC_{speed}$$

Where, in both expressions, $t_2$ is a value of time where the back-EMF plot 204 has a value of zero; $t_{-3}$ is another value of time where the back-EMF plot 204 has a value of zero; $t_{23}$ is a value of time where the combined Hall state changes from 2 to 3; and 30 is the number of degrees of rotation between $t_{-3}$ and the ideal commutation point 200, and between $t_2$ and the ideal commutation point 200. The Hall-effect sensor offsets $\phi_B$, $\phi_C$ are similarly calculated.

The ideal commutation point 200 is related to the location of the back-EMF zero-crossings, and is located at a predetermined number of degrees between two consecutive back-EMF zero-crossings. In an embodiment, the ideal commutation point is located at thirty degrees between two consecutive back-EMF zero-crossings. To improve performance of the BLDC motor 100 and the rear drive unit clutch 10, the method described herein causes the signals of the Hall-effect sensors 102, 104, 106 to correspond with the back-EMF zero-crossings. The gap between the ideal commutation point 200 and the Hall-effect sensor signals is the Hall-effect sensor offsets $\phi_A$, $\phi_B$, $\phi_C$.

Figure 9:
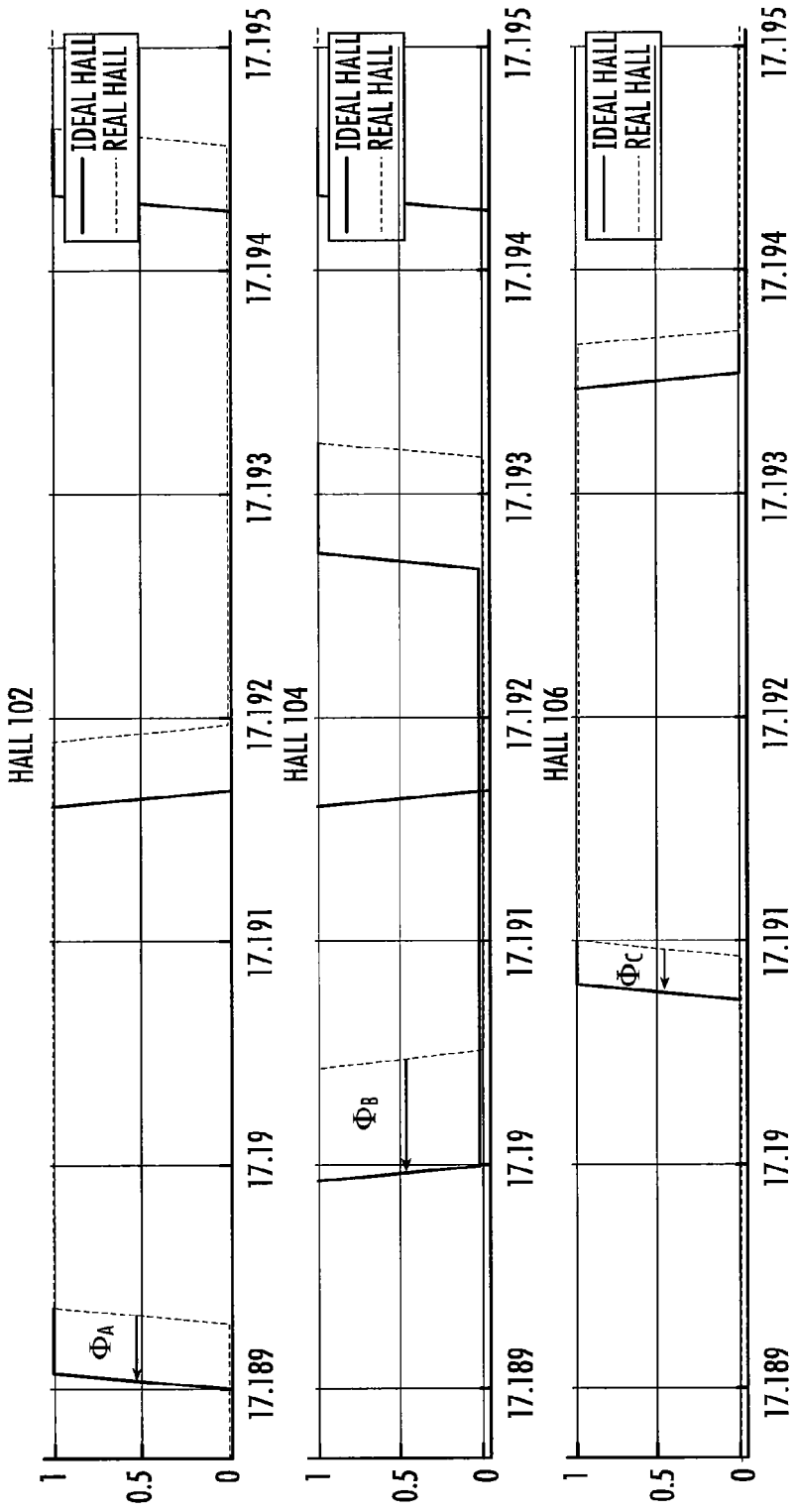
FIG. 9 is a graphic representation of advancing actual Hall-effect sensor state changes compared with ideal state changes according to an embodiment of the presently disclosed subject matter.

A second step in changing Hall states at the optimal commutation point includes determining the value of time to delay commutation utilizing the Hall-effect sensor offsets $\phi_A$, $\phi_B$, $\phi_C$. Where the Hall-effect sensor offsets $\phi_A$, $\phi_B$, $\phi_C$ comprise a negative value, commutation is advanced during counterclockwise rotation (i.e., clamping of the rear drive unit clutch pack). Where the Hall-effect sensor offsets $\phi_A$, $\phi_B$, $\phi_C$ comprise a positive value, commutation is delayed during counterclockwise rotation (i.e., transitioning of the rear drive unit clutch pack from a non-torque transmitting position to a torque transmitting position). With reference to FIG. 9, the calculation for determining the time to delay commutation where $\phi_B$ is negative and $\phi_A$ is negative may be expressed as:

$$T_{commut\_2} = T_{hallchange\_1} + (60 - |\phi_A|)/BLDC_{speed}$$

The calculation for determining the time to delay commutation where $\phi_B$ is negative and $\phi_A$ is positive may be expressed as:

$$T_{commut\_2} = T_{hallchange\_1} + (60 + |\phi_A|)/BLDC_{speed}$$

Where $T_{commut\_2}$ is the time delay of commutation for Hall-effect sensor 104; $T_{hallchange\_1}$ is the time of state change for Hall-effect sensor 102; 60 is the number of degrees of rotation in a Hall state; $\phi_A$ is the offset of Hall-effect sensor 102; and $BLDC_{speed}$ is the rotational speed of the BLDG motor 100.

Figure 10:
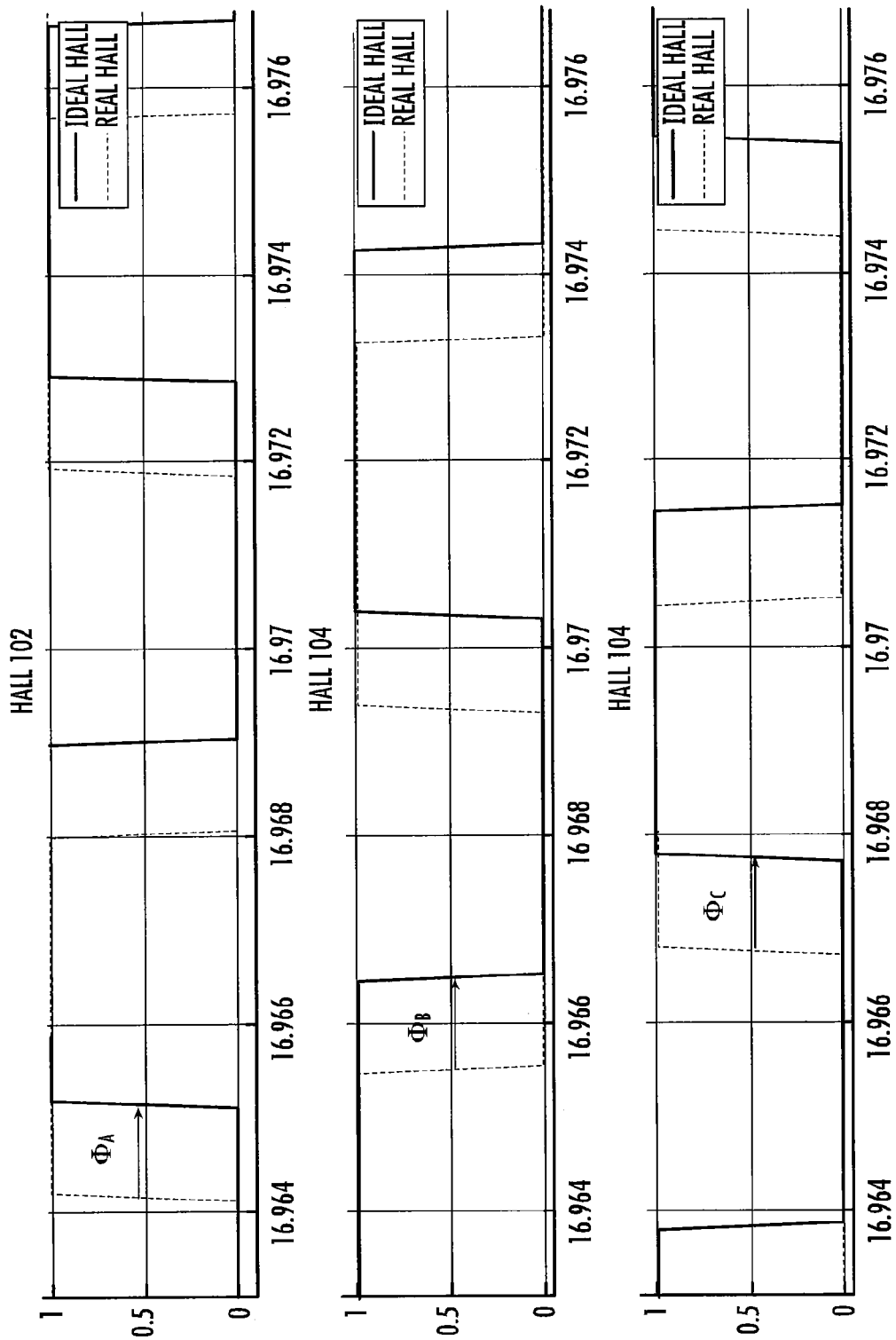
FIG. 10 is a graphic representation of delaying actual Hall-effect sensor state changes compared with ideal state changes according to an embodiment of the presently disclosed subject matter.

With reference to FIG. 10, the calculation for determining the time to delay commutation where $\phi_A$ is positive and (PB is positive may be expressed as:

$$T_{commut\_1} = T_{hallchange\_1} + (\phi_A / BLDC_{speed})$$

Figure 11:
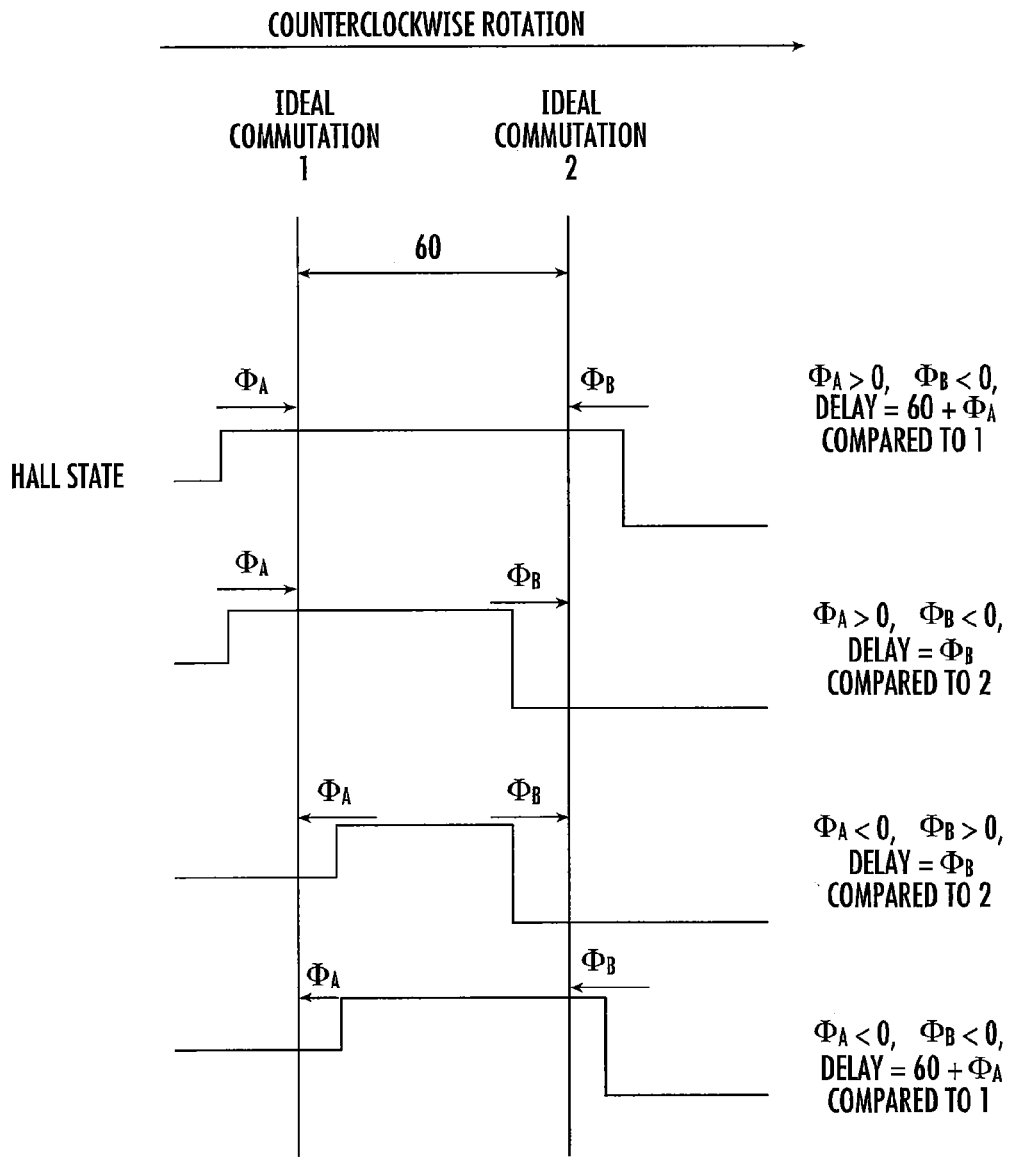
FIG. 11 illustrates combinations of positive and negative Hall-effect sensor state change offsets from ideal commutation points.
Figure 12:
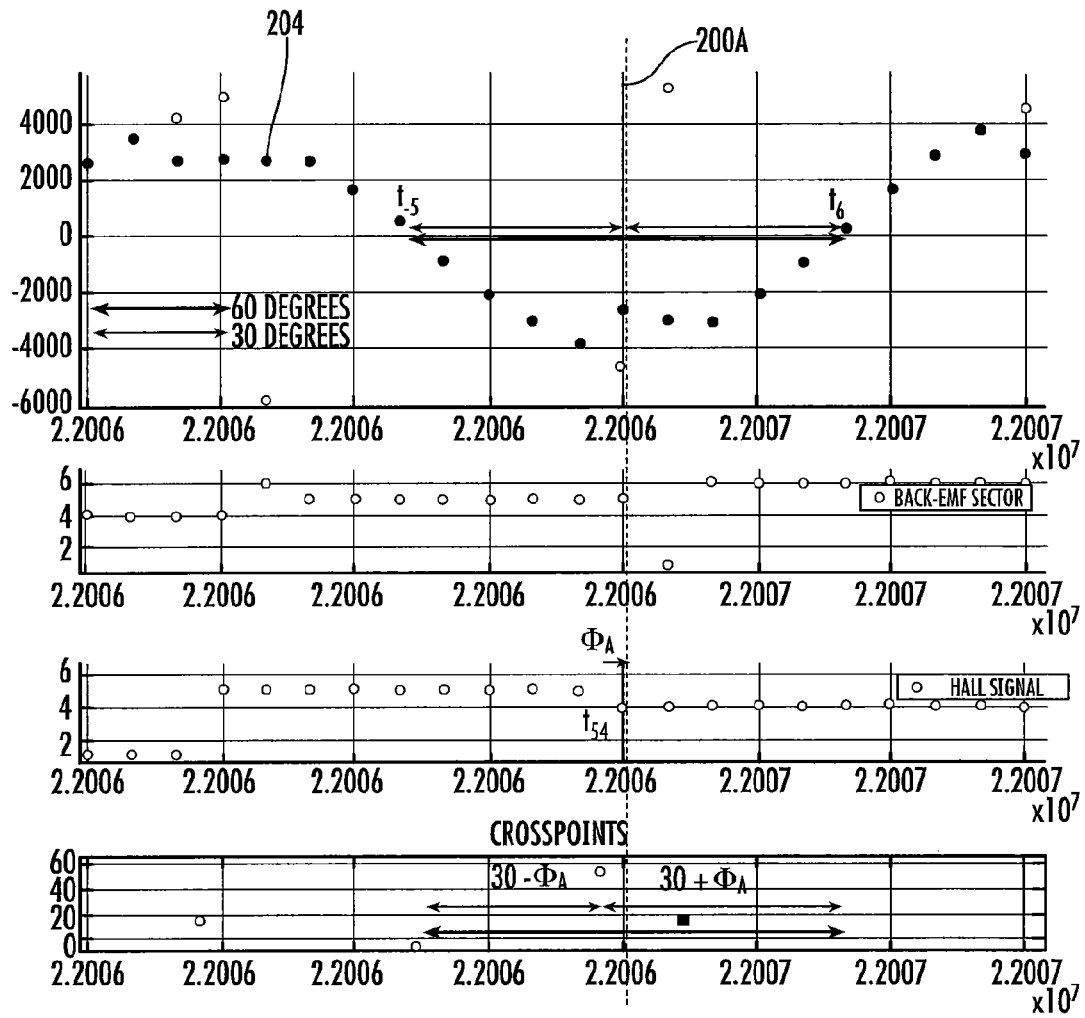
FIG. 12 is another graphic representation of back-EMF and Hall-effect sensor state changes compared with back-EMF sector, Hall-effect sensor state, back-EMF zero-crossing according to an embodiment of the presently disclosed subject matter.
Figure 13:
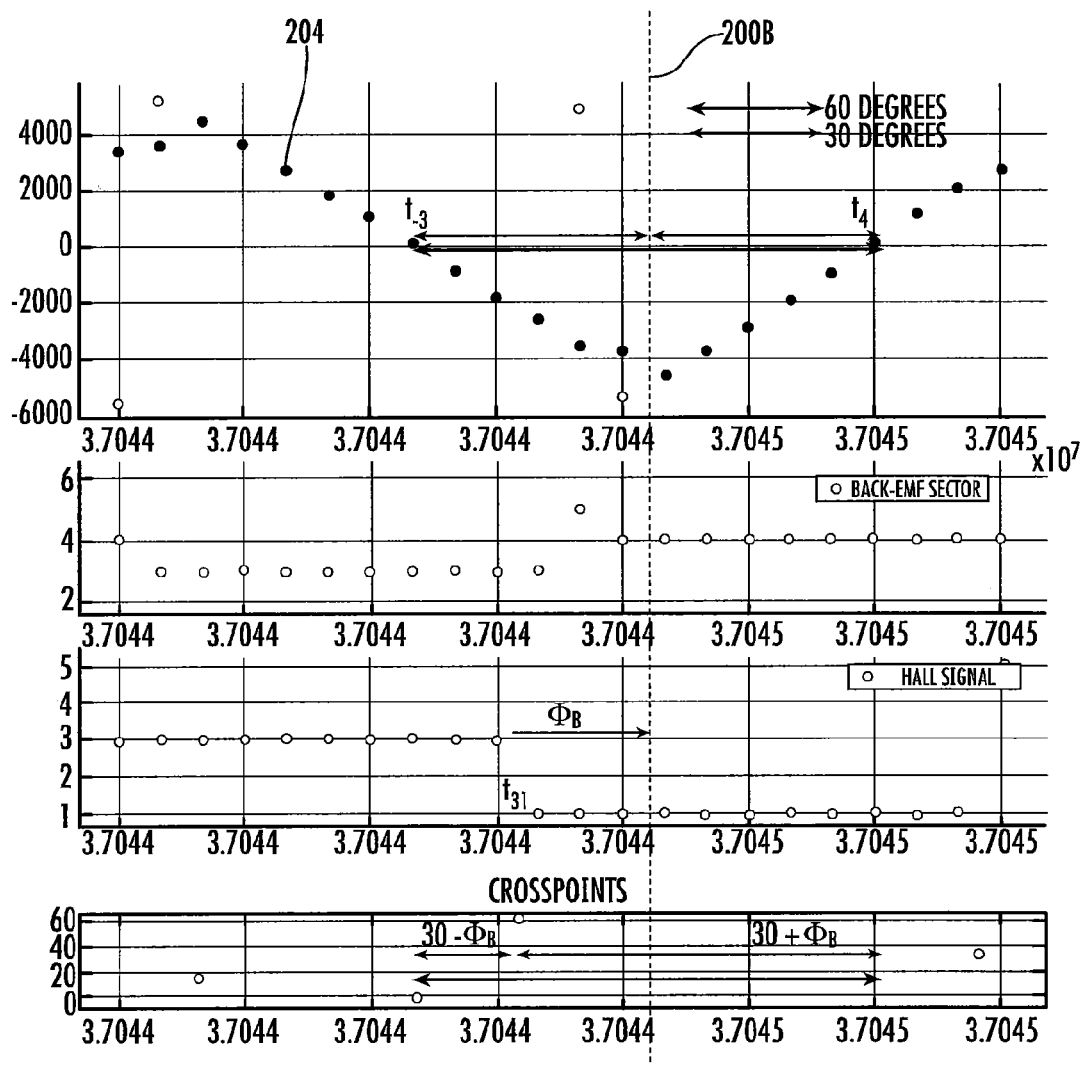
FIG. 13 is another graphic representation of back-EMF and Hall-effect sensor state changes compared with back-EMF sector, Hall-effect sensor state, back-EMF zero-crossing according to an embodiment of the presently disclosed subject matter.
Figure 14:
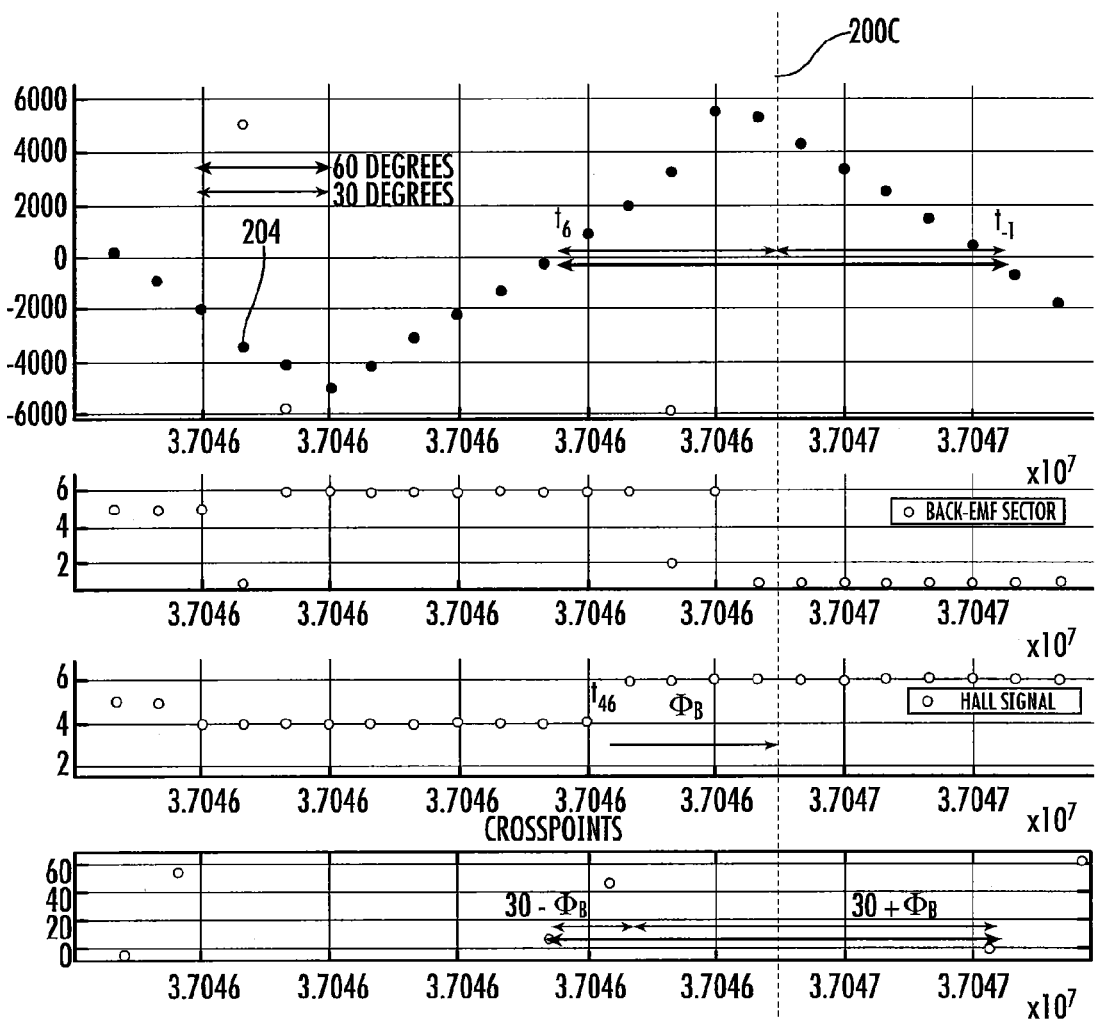
FIG. 14 is another graphic representation of back-EMF and Hall-effect sensor state changes compared with back-EMF sector, Hall-effect sensor state, back-EMF zero-crossing according to an embodiment of the presently disclosed subject matter.
Figure 15:
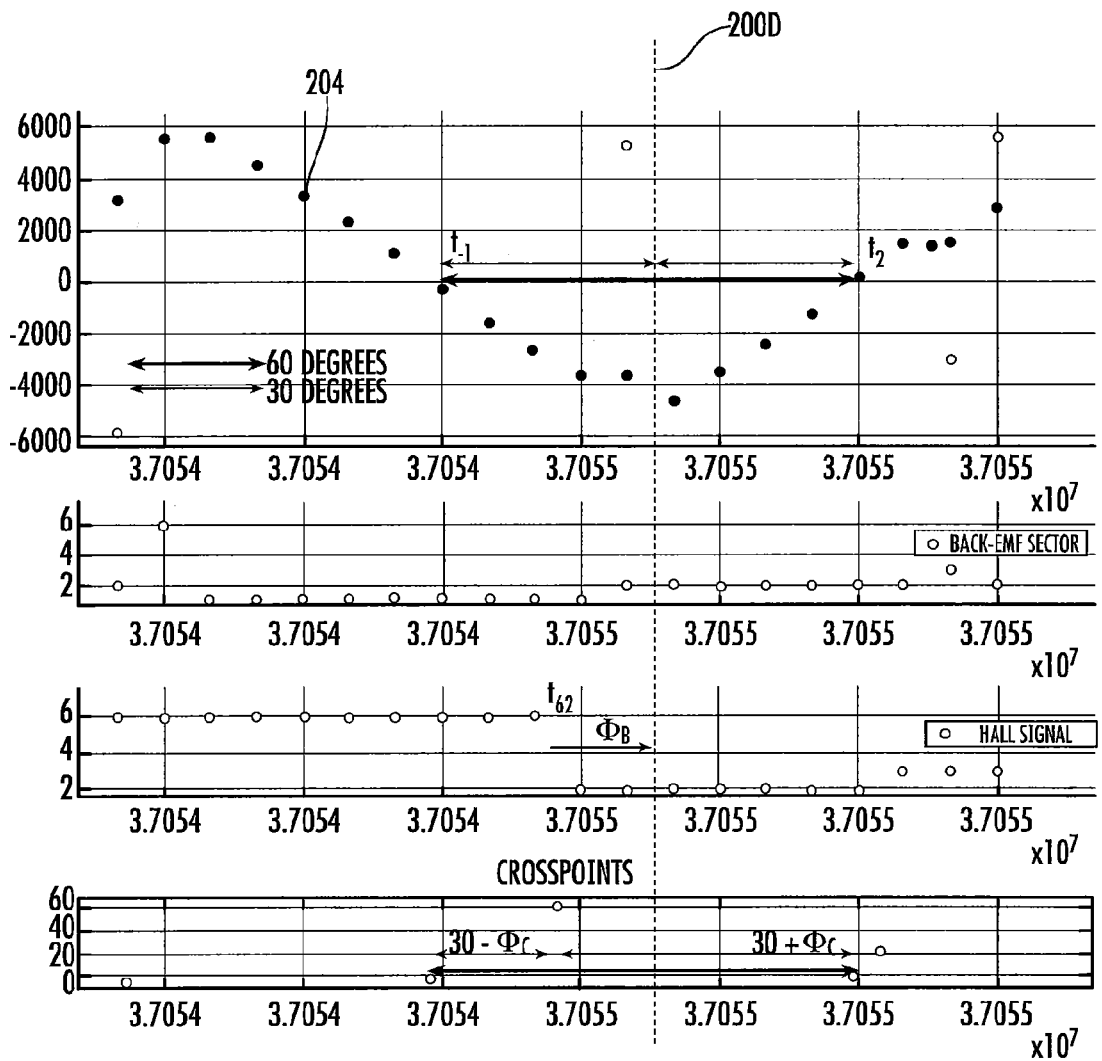
FIG. 15 is still another graphic representation of back-EMF and Hall-effect sensor state changes compared with back-EMF sector, Hall-effect sensor state, back-EMF zero-crossing according to an embodiment of the presently disclosed subject matter.
Figure 16:
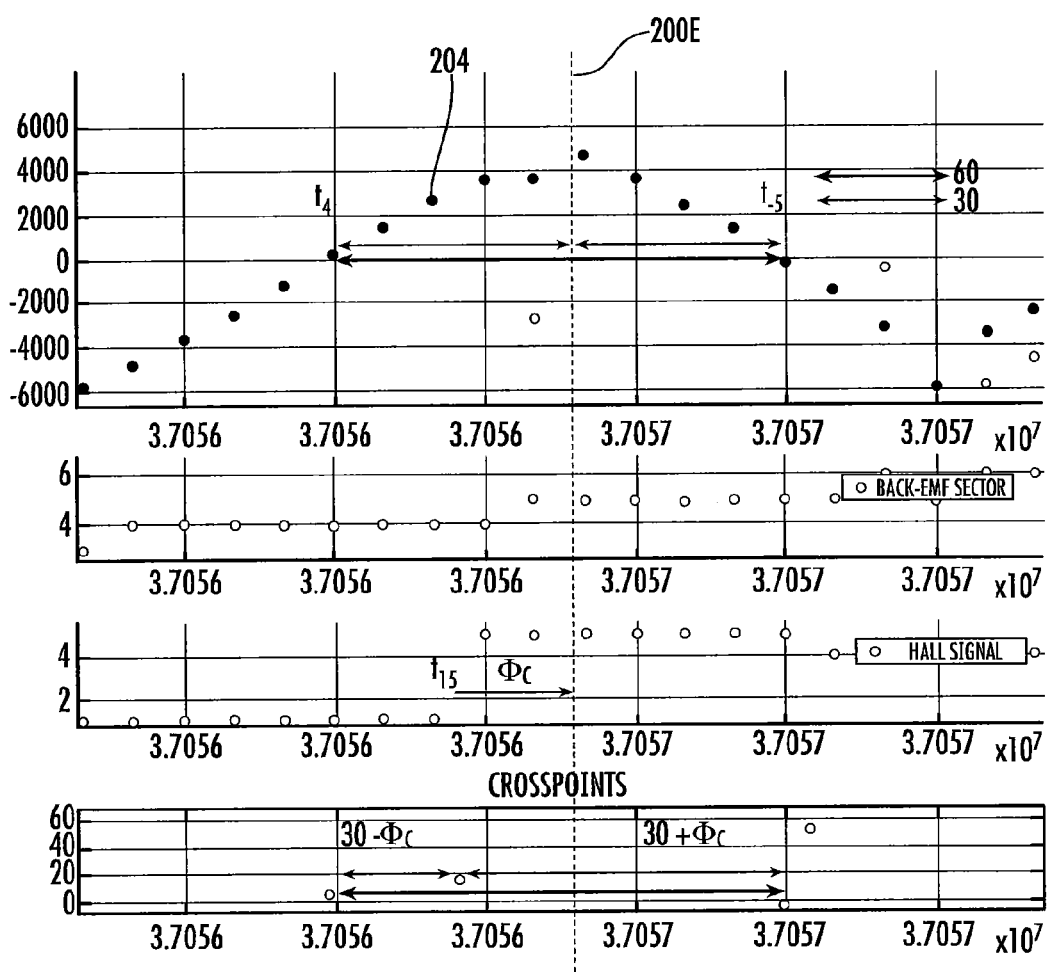
FIG. 16 is yet another graphic representation of back-EMF and Hall-effect sensor state changes compared with back-EMF sector, Hall-effect sensor state, back-EMF zero-crossing according to an embodiment of the presently disclosed subject matter.

As illustrated in FIG. 11, if (PB is negative, commutation is advanced. Therefore, Hall-effect sensor 102 signal is utilized to predict where ideal commutation occurs. To predict where ideal commutation occurs, the length of $\phi_A$ is added to the ideal Hall state length (i.e., 60 degrees). As illustrated in FIGS. 12-16, the offsets $\phi_B$ and $\phi_C$ may be determined utilizing the same method for determining $\phi_A$.

The advantages associated with the above-described method and structure include, but are not limited to, good dynamic and low speed performance as compared to direct back-EMF methods. Further, the above-described method and structure is less noise sensitive compared with known designs, which makes it more reliable and less prone to incorrect readings. Another significant advantage is that the Hall-effect sensor offsets $\phi_A$, $\phi_B$, $\phi_C$ are learned inside of the rear drive unit 10. As a result, no separate end-of-line calibration is required. The present system does require three voltage sensors (not depicted) on the controller 112. Ideally, the system uses pre-existing voltage sensors. Yet another advantage of the present system is that the BLDC motor 100 can be easily swapped for repair and/or replacement without the need for elaborate, complicated, time consuming, and/or expensive procedures.

While various embodiments of the presently disclosed subject matter have been described above, it should be understood that they have been presented by way of example, and not limitation. It will be apparent to persons skilled in the relevant arts that the disclosed subject matter may be embodied in other specific forms without departing from the spirit or essential characteristics thereof. The embodiments described above are therefore to be considered in all respects as illustrative, not restrictive.

What is claimed is:

1. A method of operating a final drive unit clutch, comprising:
  providing an electric motor coupled with a clutch, said electric motor including:
    a stator;

a first Hall-effect sensor coupled with said stator;
a second Hall-effect sensor coupled with said stator;
a third Hall-effect sensor coupled with said stator; and
a rotor having at least one magnetic pole pair;
providing a controller in electrical communication with said electric motor;
determining a first ideal commutation point;
calculating a first offset of a first Hall-effect sensor state change from said first ideal commutation point; and
calculating a time delay of commutation utilizing said first offset such that a second Hall-effect sensor state change corresponds with a second ideal commutation point;
wherein said clutch is transitioning between a non-torque transmitting position and a torque transmitting position.

2. The method of operating said final drive unit clutch according to claim 1, wherein determining at least one of said first and second ideal commutation points comprises:
calculating a first back-EMF crossing and a consecutive second back-EMF crossing from three measured phase voltages; and
determining a predetermined number of degrees between said first and second back-EMF crossings.

3. The method of operating said final drive unit clutch according to claim 2, wherein:
at least one of said first and second back-EMF crossings is calculated utilizing three measured phase voltages at an end of said first Hall-effect sensor state change a predetermined number of times.

4. The method of operating said final drive unit clutch according to claim 2, wherein:
at least one of said first and second back-EMF crossings is calculated utilizing one measured phase voltage and a DC-link voltage at the end of said first Hall-effect sensor state change a predetermined number of times.

5. The method of operating said final drive unit clutch according to claim 2, wherein:
said predetermined number of degrees between said first and second back-EMF crossings is thirty degrees.

6. The method of operating said final drive unit clutch according to claim 2, wherein calculating said first offset comprises:
calculating a difference by subtracting a time of said first Hall-effect sensor state change from a time of said second back-EMF crossing;
calculating a product by multiplying said difference by a speed of an output of said electric motor; and
subtracting thirty rotational degrees from said product.

7. The method of operating said final drive unit clutch according to claim 2, wherein calculating said first offset comprises:
calculating a difference by subtracting a time of said first consecutive back-EMF crossing from said first Hall-effect sensor state change;
calculating a product by multiplying said difference by a speed of an output of said electric motor; and
subtracting said product from thirty rotational degrees.

8. The method of operating said final drive unit clutch according to claim 1, wherein calculating a time delay of commutation comprises:
determining said first offset has a negative value;
determining a second offset has a negative value;
calculating a difference by subtracting an absolute value of said first offset from sixty rotational degrees;
calculating a quotient by dividing said difference by a speed of an output of said electric motor; and
adding said quotient to said time of said first Hall-effect sensor state change.

9. The method of operating said final drive unit clutch according to claim 1, wherein calculating a time delay of commutation comprises:
determining said first offset has a positive value;
determining a second offset has a negative value;
calculating a sum by adding said first offset to sixty rotational degrees;
calculating a quotient by dividing said sum by a speed of an output of said electric motor; and
adding said quotient to said time of said first Hall-effect sensor state change.

10. The method of operating said final drive unit clutch according to claim 1, wherein calculating a time delay of commutation comprises:
determining said first offset has a positive value;
determining a second offset has a positive value;
calculating a quotient by dividing said first offset by a speed of an output of said electric motor; and
adding said quotient to said time of said first Hall-effect sensor state change.

11. A method of operating a final drive unit clutch, comprising:
providing an electric motor coupled with a clutch, said electric motor including:
a stator;
a first Hall-effect sensor coupled with said stator;
a second Hall-effect sensor coupled with said stator;
a third Hall-effect sensor coupled with said stator; and
a rotor having at least one magnetic pole pair;
providing a controller in electrical communication with said electric motor;
determining a first ideal commutation point;
calculating a first offset of a first Hall-effect sensor state change from said first ideal commutation point;
calculating a first time delay of commutation utilizing said first offset such that a second Hall-effect sensor state change corresponds with a second ideal commutation point;
determining said second ideal commutation point;
calculating a second offset of said second Hall-effect sensor state change from said second ideal commutation point;
calculating a second time delay of commutation utilizing said second offset such that a third Hall-effect sensor state change corresponds with a third ideal commutation point;
determining said third ideal commutation point;
calculating a third offset of said third Hall-effect sensor state change from said third ideal commutation point; and
calculating a third time delay of commutation utilizing said third offset such that a fourth Hall-effect sensor state change corresponds with a fourth ideal commutation point;
wherein said clutch is transitioning between a non-torque transmitting position and a torque transmitting position.

* * * * *